United States Patent [19]
Batz

[11] 3,710,204
[45] Jan. 9, 1973

[54] SEMICONDUCTOR DEVICE HAVING A SCREEN ELECTRODE OF INTRINSIC SEMICONDUCTOR MATERIAL

[75] Inventor: Monika Batz, Heilbronn/Neckar, Germany

[73] Assignee: Telefunken Patentverwertungsgesellschaft m.b.H., Ulm/Donau, Germany

[22] Filed: April 16, 1971

[21] Appl. No.: 134,877

Related U.S. Application Data

[63] Continuation of Ser. No. 730,097, May 17, 1968, abandoned.

[52] U.S. Cl....317/235 R, 317/234 N, 317/235 WW, 317/235 AH

[51] Int. Cl...........................H01l 11/00, H01l 15/00

[58] Field of Search........317/234, 5.4, 235, 21, 40.1, 317/46.1, 48.7

[56] References Cited

UNITED STATES PATENTS

| | | | |
|---|---|---|---|
| 3,405,329 | 10/1968 | Loro et al. | 317/235 X |
| 3,446,995 | 5/1969 | Castrucci | 317/235 |
| 3,475,234 | 10/1969 | Kerwin et al. | 317/235 |
| 3,489,953 | 1/1970 | Thomas | 317/235 |

OTHER PUBLICATIONS

IBM Technical Disclosure Bulletin, by Lehman, Vol. 8, No. 4, September, 1965.

*Primary Examiner*—John W. Huckert
*Assistant Examiner*—Andrew J. James
*Attorney*—Spencer & Kaye

[57] ABSTRACT

A semiconductor device having a semiconductor body, an insulating layer arranged on the semiconductor body and a screen electrode covering a portion of the surface of the insulating layer, and a method of making the semiconductor device. According to the invention the screen electrode is made of semiconductor material. The method includes the steps of applying the insulating layer to the surface of the semiconductor body, applying the semiconductor layer to the surface of the insulating layer to form a screen electrode and etching a diffusion window through the semiconductor layer and the insulating layer to expose the surface of the semiconductor body.

9 Claims, 4 Drawing Figures

PATENTED JAN 9 1973

3,710,204

Inventor:
Monika Batz
By: Spencer & Kaye
Attorneys

SEMICONDUCTOR DEVICE HAVING A SCREEN ELECTRODE OF INTRINSIC SEMICONDUCTOR MATERIAL

CROSS REFERENCE TO RELATED APPLICATION

This application is a continuation of U.S. Pat. application Ser. No. 730,097 filed May 17th, 1968 and now abandoned.

BACKGROUND OF THE INVENTION

The present invention relates to a semiconductor device having a semiconductor body, an insulating layer arranged thereon and a screen electrode arranged on and covering at least a portion of the surface of the insulating layer.

Screen electrodes, also called "field relief electrodes," are arranged on a semiconductor device to shunt off electrical charges from the surface of a passivating insulating layer. In the case of transistors, for example, the electrical charges are led off to the collector.

The effectiveness of a screen electrode depends to a large extent upon the closeness with which it extends to the edge of the diffusion window of the semiconductor device. In planar semiconductor devices of the prior art which employ screen electrodes made, for example, of aluminum, molybdenum, titanium, or of electrically conducting compounds such as titanium oxide or chromic oxide, it has not been possible to arrange the screen electrodes closer than 5 microns from the planar window.

SUMMARY OF THE INVENTION

An object of the present invention, therefore, is to provide a semiconductor device, for example of the planar type, which has a screen electrode that can extend directly to the edge of the diffusion window.

This as well as other objects which will become apparent in the discussion that follows is achieved, according to the present invention, by making the screen electrode out of semiconductor material.

According to a particular embodiment of the present invention, planar semiconductor devices having screen electrodes are manufactured in the following manner: Prior to etching the planar window and prior to the planar diffusion of impurities through the planar window, a thin semiconductor layer is applied to the surface of the insulating layer on the semiconductor body. The diffusion window is then etched through this semiconductor layer as well as through the passivating layer so that the semiconductor layer will extend to the edge of the diffusion window.

This method according to the present invention is simpler than the method used in the prior art for manufacturing planar semiconductor devices having screen electrodes. To prevent the screen electrodes from extending to the edges of the diffusion windows, the method of the prior art required an additional adjusting and photoengraving step.

No difficulty is encountered with the semiconductor device and method according to the present invention if the diffusion is carried out after the screen electrode has been applied. Since the screen electrodes consist of highly pure semiconductive material there is no danger that undesirable impurities will be diffused into the semiconductor body.

The screen electrode according to the present invention preferably consists of a thin semiconductor layer with a thickness of less than 1 micron. It is recommended, in fact, that the semiconductor layer be made still thinner, for example, thinner than 0.1 microns. Germanium or silicon are exemplary of the semiconductor material suitable for the screen electrodes.

According to another particular embodiment of the present invention it is suggested that the screen electrode be manufactured of intrinsic semiconductor material.

In a still further particular embodiment of the present invention an additional insulating layer is applied to the screen electrode of semiconductor material. Like the insulating layer located directly on the semiconductor body, this additional layer may consist, for example, of silicon dioxide or silicon nitride.

DESCRIPTION OF THE PREFERRED EMBODIMENTS

Figure 1:
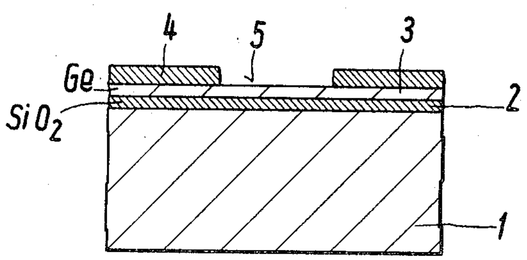
FIG. 1 is a schematic cross-sectional diagram of a semiconductor device according to the present invention in the first stage of manufacture.

Referring now to the drawing, FIGS. 1, 2, 3 and 4 illustrate both the semiconductor device and the method of making the semiconductor device according to various embodiments of the present invention. Identical elements in FIGS. 1–4 are provided with identical reference numerals.

To manufacture a planar semiconductor device according to the present invention a semiconductor body 1 is covered with a passivating insulating layer 2 such as a pyrolytically deposited $SiO_2$-layer. The semiconductor body is subsequently inserted into high vacuum vaporizing apparatus and after the pressure is dropped to $10^{-5}$ Torr it is heated to a temperature of 280°–300° C. Intrinsic germanium is then evaporated onto the insulating layer 2 of the semiconductor body 1 from a tungsten or tantalum coil. This produces the germanium layer 3 which will serve as the screen electrode. The thickness of the layer is preferably approximately 0.1 microns.

After the germanium has been deposited a photo "resist" or coating 4 is applied to the germanium layer 3. This coating 4 is then selectively illuminated, developed and removed again from that region where a planar window is desired; i.e., where it is desired to separately diffuse impurities into the semiconductor body. The result is a photo coating mask with a recess 5.

The semiconductor layer 3 as well as the insulating layer 2 adjacent to the semiconductor body are then etched with the aid of the photocoating mask. Into the layers 2 and 3 is etched a diffusion window 6, shown in FIG. 2, which exposes the semiconductor body in the diffusion region. A semiconductor zone 7 having a conductivity type opposite to the conductivity of the semiconductor body, can then be created by the diffusion of impurities through the window into the semiconductor body.

Figure 2:
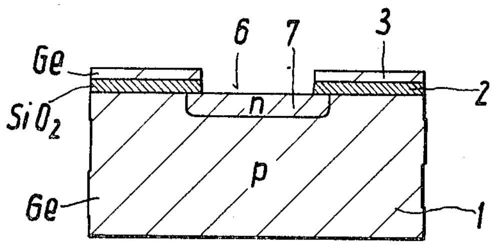
FIG. 2 is a schematic cross-sectional diagram of a diode according to the present invention.
Figure 3:
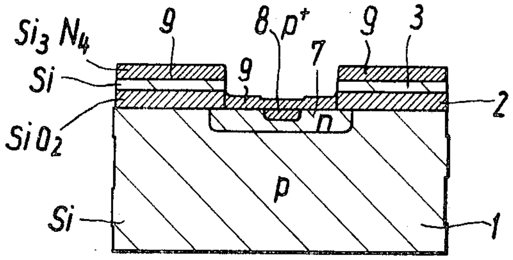
FIG. 3 is a schematic cross-sectional diagram of a transistor according to the present invention.

Whereas the diffusion of a single zone into the semiconductor body produces a diode as shown in FIG. 2 the diffusion of an additional zone, as shown in FIG. 3, results in a planar transistor. The emitter zone 8 is diffused, in this case, into the base zone 7 with the aid of the diffusion mask 9 of silicon nitride, which covers the semiconductor layer 3 and the semiconductor body 1 in the region of the diffusion window 6. The emitter zone 8 is created by the diffusion of impurities through a window in the diffusion mask 9 which is, however, not shown in FIG. 3. FIG. 3 only shows the complete transistor at which the window for the diffusion is already closed by oxydation, for example.

Figure 4:
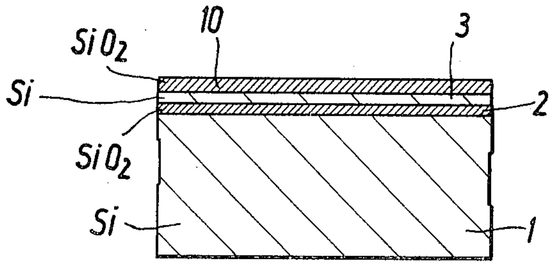
FIG. 4 is a schematic cross-sectional diagram of a semiconductor device, according to a particular embodiment of the present invention, in an initial stage of manufacture.

FIG. 4 illustrates a still further embodiment of the present invention wherein a passivating layer 10 is applied to the semiconductor layer 3. This additional passivating layer 10 is advantageous since it electrically insulates the outside surface of the semiconductor layer 3.

In the embodiments shown in FIG. 4 the diffusion window is etched through both the insulating layers and through the semiconductor layer sandwiched between them.

In actual practice the present invention is preferably employed using the modern wafer technology wherein a plurality of diodes, transistors or integrated circuits are manufactured simultaneously.

It will be understood that the above description of the present invention is susceptible to various modifications, changes and adaptations, and the same are intended to be comprehended within the meaning and range of equivalents of the appended claims.

I claim:

1. In a bi-polar semiconductor device having a semiconductor body containing zones of alternating conductivity type adjacent a single surface thereof, a first insulating layer arranged on said surface of said semiconductor body and containing a diffusion window through which the impurity for one of said zones was diffused into said surface, and a field relief electrode covering at least a portion of the surface of said insulating layer for shunting off electrical charges from the surface of said insulating layer, the improvement wherein said field relief electrode is formed by a layer of intrinsic semiconductor material which extends across the surface of said first insulating layer to the edge of said window.

2. The improvement defined in claim 1, wherein said field relief electrode consists of a thin semiconductor layer having a maximum thickness of 1 micron.

3. The improvement defined in claim 2, wherein the maximum thickness of said semiconductor layer is 0.1 micron.

4. The improvement defined in claim 1, wherein said field relief electrode consists of a material selected from the group consisting of germanium and silicon.

5. The improvement defined in claim 1, wherein said first insulating layer is made of a material selected from the group consisting of silicon dioxide and silicon nitride.

6. The improvement defined in claim 1, further comprising a second insulating layer arranged on the surface of said field relief electrode.

7. The improvement defined in claim 6, wherein said first and second insulating layers are made of a material selected from the group consisting of silicon dioxide and silicon nitride.

8. The improvement defined in claim 1, wherein said bipolar semiconductor device is a diode.

9. The improvement defined in claim 1, wherein said bipolar semiconductor device is a transistor and wherein said one of said zones is the base zone, whereby said layer of intrinsic semiconductor material overlies the edge of the base-collector p-n junction which extends to said surface.

* * * * *